(12) United States Patent
Kusunoki

(10) Patent No.: US 6,556,079 B2
(45) Date of Patent: Apr. 29, 2003

(54) DISTORTION COMPENSATING DEVICE AND METHOD FOR COMPENSATING DISTORTION

(75) Inventor: Shigeo Kusunoki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/963,295

(22) Filed: Sep. 26, 2001

(65) Prior Publication Data

US 2002/0079963 A1 Jun. 27, 2002

(30) Foreign Application Priority Data

Sep. 29, 2000 (JP) ........................................ 2000-301406

(51) Int. Cl.[7] ................................................ H03F 1/26
(52) U.S. Cl. ........................ 330/149; 330/107; 330/136
(58) Field of Search ................................. 330/107, 136, 330/149, 129

(56) References Cited

U.S. PATENT DOCUMENTS 5,151,664 A * 9/1992 Suematsu et al. ........... 330/149
6,107,880 A * 8/2000 Shaw .......................... 330/136
6,262,629 B1 * 7/2001 Stengel et al. ........... 330/124 R

FOREIGN PATENT DOCUMENTS

WO    WO 99/17440    * 4/1999    ............. H03F/1/32

* cited by examiner

*Primary Examiner*—Henry Choe
(74) *Attorney, Agent, or Firm*—Jay H. Maioli

(57) ABSTRACT

A distortion compensating device which can significantly remove residual distortion, in which a value of matching circuit 11 is set up so that the distortion generated at a gain controlling unit 9 offsets the distortion remaining in a power amplifier 12. That is, the value of the matching circuit 11 is set up so that the phase of the residual distortion included in the output of the matching circuit 11 is rendered opposite to the phase of the residual distortion included in the output of the power amplifier 12. Thus, the residual distortion included in the output of the power amplifier 12 is offset by the residual distortion included in the output of the gain controlling unit 9, thereby the residual distortion can be removed.

4 Claims, 4 Drawing Sheets

DISTORTION COMPENSATING DEVICE AND METHOD FOR COMPENSATING DISTORTION

BACKGROUND OF THE INVENTION

1. Field of the Invention

The present invention relates to a distortion compensating device, in particular, to a distortion compensating device applicable to a high-frequency power amplifier for radio transmission for use in a wireless telephone apparatus, and a method for compensating distortion using the distortion compensating device.

2. Description of Related Art

Recently, as radio communication is being performed at high speed with largely increased capacity, linearity required by a power amplifier for radio transmission for use in a digital radio communication apparatus is becoming strict, which concurrently prevents improvement of power efficiency of a power amplifier.

On the other hand, consecutive talk time of widely spread digital wireless telephone apparatuses is being extended. Thus, in view of the marketing strategy of new digital radio communication apparatuses, putting an emphasis on extending the consecutive usage time cannot be ignored. So, the power efficiency of a power amplifier is being improved by employing a technique for compensating distortion.

However, this distortion compensating technique renders the circuit configuration enlarged, which makes it difficult to employ the technique in a wireless telephone apparatus which is required to be decreased in size and weight. Furthermore, due to the characteristics of a portable terminal, the environment to which a wireless telephone apparatus belongs will be varied significantly. Thus, the technique for compensating distortion should be that which can be adapted to the environment variation, which is an important subject as well as the miniaturization thereof.

There is disclosed "linear transmission device" which employs an example of a conventional adaptive distortion compensating technique in the Japanese published patent number 2689011. FIG. 1 shows a block diagram of the configuration of the linear transmission device disclosed in the patent publication. As shown, the linear transmission device includes a power amplifier 59 which receives a modulated signal, a DC voltage converting circuit 55 for supplying a DC bias voltage to the power amplifier 59, and a directional coupler 52 and an envelope detecting circuit 53 for controlling the output voltage of the DC voltage converting circuit 55 in accordance with envelope signal level of the modulated signal received by the power amplifier 59. The input signal to be received by the power amplifier 59 is a modulated analog signal or a modulated digital signal, which is sent from a modulated signal input terminal 51. An amplified signal from the power amplifier 59 is to be output from an output terminal 62. A DC voltage terminal 56 supplies a DC voltage to the DC voltage converting circuit 55. The feature of the linear transmission device is that the signal to be received by the power amplifier 59 is controlled in accordance with the difference between the envelope signal level of the modulated signal and the envelope signal level of the output signal of the power amplifier 59. Thus, the linear transmission device further includes a directional coupler 60, an envelope detecting circuit 61, a differential signal generating circuit 54, a DC amplifier 57, and a power controlling circuit 58.

That is, the linear transmission device detects an envelope of the input signal and that of the output signal of the power amplifier 59, whose distortion should be compensated, by the envelope detecting circuit 53 and envelope detecting circuit 61, respectively. Then, the differential signal generating circuit. 54 generates a differential signal therebetween to send the signal to the DC amplifier 57, and the DC amplifier 57 amplifies the differential signal to generate a controlling signal and -sends the controlling signal to the power controlling circuit 58, and then the power controlling circuit 58 increases or decreases the level of the signal to be sent to the power amplifier 59. Thus, variation of gain of the power amplifier 59 due to temperature variation etc. is removed. Furthermore, since the DC voltage converting circuit 55 generates a voltage which varies in proportion to the envelope of the input signal and supplies the voltage to the power amplifier 59, the distortion of the power amplifier 59 can be compensated.

In performing above-described conventional distortion compensating technique, power controlling is performed by detecting the envelope of the input signal and that of the output signal and compensating the difference therebetween being the distortion. On the other hand, other distortion due to noise generated by the subtracting circuit (differential signal generating circuit 54) and amplifier (DC amplifier 57), and that due to nonlinearity can not be compensated, and thus generated distortion undesirably remains in the linear transmission, device.

SUMMARY OF THE INVENTION

It is therefore an object of the present invention to overcome the above mentioned drawbacks by providing a distortion compensating device which can significantly remove residual distortion, and a method for compensating distortion using the distortion compensating device.

According to the present invention, there is provided a distortion compensating device for compensating distortion generated at a device, including:

means for detecting an envelope voltage of an input signal supplied to the device;

means for generating an amplitude controlling signal adapted for controlling the amplitude of the input signal in accordance with the envelope voltage detected by the envelope voltage detecting means; and means for controlling the amplitude of the input signal based on the amplitude controlling signal generated by the amplitude controlling signal generating means;

the distortion remaining in the output of the device being compensated based on the output of the amplitude controlling means.

Specifically, according to the present invention, the phase of distortion included in the output of the amplitude controlling means is rendered opposite to the phase of the distortion remaining in the output of the device.

According to the present invention, there is also provided a method for compensating distortion generated at a device, including the steps of:

detecting an envelope voltage of an input signal supplied to the device;

generating an amplitude controlling signal adapted for controlling the amplitude of the input signal in accordance with the envelope voltage detected at the envelope voltage detecting step;

controlling the amplitude of the input signal based on the amplitude controlling signal generated at the amplitude controlling signal generating step; and compensating the distortion remaining in the output of the device based on the output generated at the amplitude controlling step.

According to the present invention, residual distortion can significantly be removed.

These objects and other objects, features and advantages of the present invention will become more apparent from the following detailed description of the preferred embodiments of the present invention when taken in conjunction with the accompanying drawings.

DESCRIPTION OF THE PREFERRED EMBODIMENTS

Preferred embodiments of the distortion compensating device, and the method for compensating distortion using the distortion compensating device according to the present invention will further be described below with reference to the accompanying drawings. The distortion compensating device is adapted for compensating distortion of a high-frequency power amplifier (referred to as a power amplifier, hereinafter) for radio transmission for use in a digital radio communication apparatus.

Figure 1:
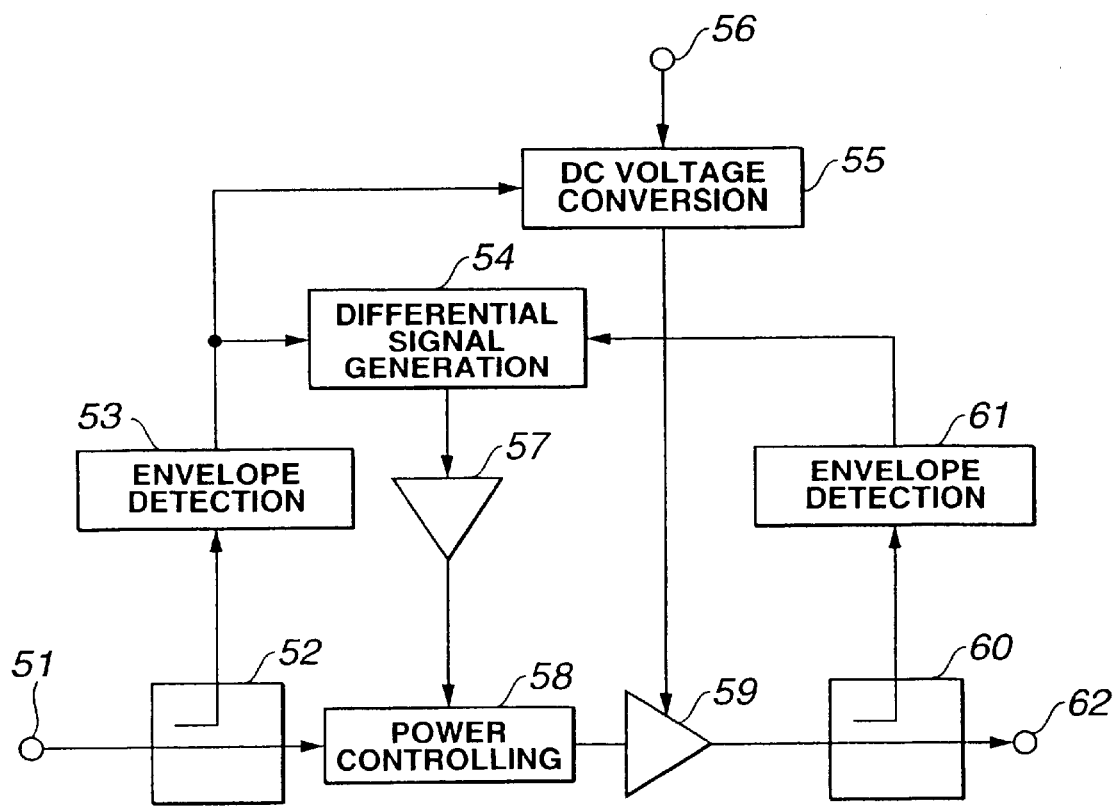
FIG. 1 shows a block diagram of the configuration of the conventional applicable distortion compensating device.
Figure 2:
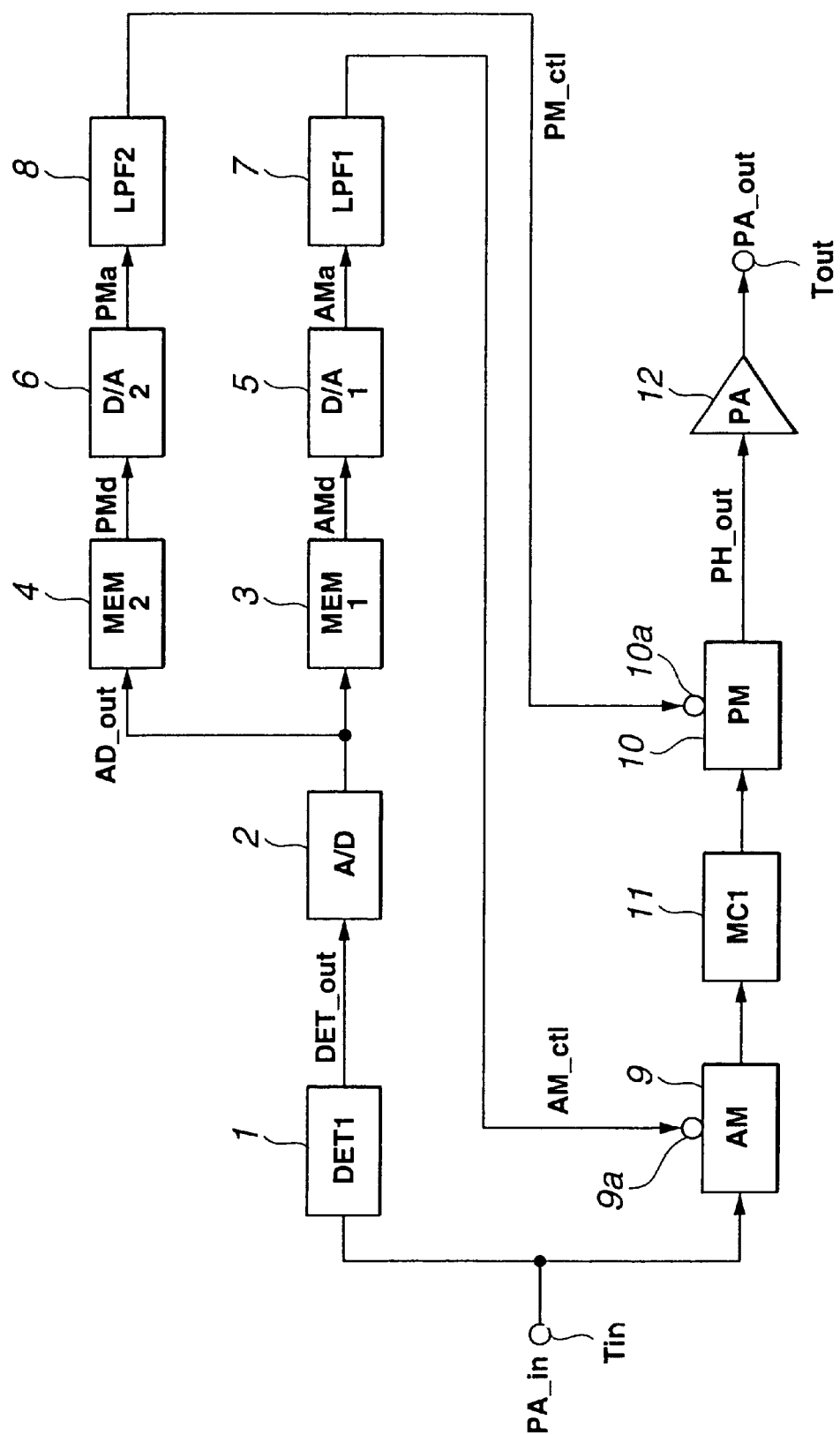
FIG. 2 shows a block diagram of a first embodiment of the applicable distortion compensating device according to the present invention.

FIG. 2 shows a block diagram of a first embodiment of the distortion compensating device according to the present invention. As shown, the distortion compensating device includes a first envelope detecting unit (DET1) 1 for detecting an envelope voltage DET_out of a high-frequency signal PA_in to be supplied to a power amplifier 12, an amplitude controlling signal generating unit for generating an amplitude controlling signal AM_ctl which controls the amplitude of the high-frequency signal PA_in in accordance with the envelope voltage DET_out detected by the first envelope detecting unit 1, and a gain controlling unit 9 for controlling the amplitude of the high-frequency signal PA_in based on the amplitude controlling signal AM_ctl generated by the amplitude controlling signal generating unit. And, the distortion compensating device compensates distortion remaining in the output of the power amplifier 12 based on the output of the gain controlling unit 9. Thus, the distortion compensating device further includes a matching circuit (MC1) 11 for rendering the phase of distortion included in the output of the gain controlling unit 9 opposite to the phase of the distortion remaining in the output of the power amplifier 12.

Next, the detailed configuration of the distortion compensating device will be explained with reference to FIG. 2. The distortion compensating device includes the first envelope detecting unit (DET1) 1 for receiving a part of the high-frequency signal PA_in with its envelope varied which is sent to an input terminal Tin and detecting the envelope voltage DET_out thereof, an A/D converter 2 for digitizing the envelope voltage DET_out detected by the first envelope detecting unit 1 and outputting a digital data AD_out, two memories (MEM1, MEM2) 3, 4 for letting the digital data AD_out be an address and outputting data corresponding to the address, a first D/A converter (D/A1) 5 for converting digital data AMd output from the memory 3 to analog data and outputting an analog signal AMa, a first low pass filter (LPF1) 7, connected to the output terminal of the first D/A converter 5, for removing digital noise included in the analog signal AMa and outputting the amplitude controlling signal AM_ctl, the gain controlling unit (AM) 9, being a high-frequency signal amplifier and a gain controlling unit whose gain is varied in accordance with a voltage supplied to a controlling input terminal 9a, for sending the amplitude controlling signal AM_ctl to the controlling input terminal 9a, a second D/A converter (D/A2) 6 for converting digital data PMd output from the memory 4 to analog data and outputting an analog signal PMa, a second low pass filter (LPF2) 8, connected to the output terminal of the second D/A converter 6, for removing digital noise included in the analog signal PMa and outputting a phase controlling signal PM_ctl, a phase controlling unit (PM) 10, being a high-frequency signal phase shifter whose value of passing phase is varied in accordance with a voltage supplied to a controlling input terminal 10a, for sending the phase controlling signal PM_ctl to the controlling input terminal 10a, the matching circuit (MC1) 11, connected between the gain controlling unit 9 and the phase controlling unit 10, for receiving the high-frequency signal PA_in whose gain is controlled, and a power amplifier (PA) 12, whose distortion should be compensated, for receiving the output of the phase controlling unit 10.

Next, the operation of thus configured distortion compensating device shown in FIG. 2 will be explained. The memory 3 has written in advance therein data for compensating amplitude distortion of the power amplifier 12. The amplitude compensating data which depends on each input envelope voltage is output by making the data written in the memory 3 correspond to an address which is varied in accordance with the variation of the envelope voltage of the high-frequency signal PA_in and outputting the data. The amplitude compensating data is converted to analog data by the first D/A converter 5, thereby the analog signal AMa can be obtained. The first low pass filter (LPF1) 7 removes digital noise included in the analog signal AMa and outputs the amplitude controlling signal AM_ctl. The amplitude controlling signal AM_ctl is sent to the controlling input terminal 9a of the gain controlling unit 9. The gain controlling unit 9 compensates the amplitude of the high-frequency signal PA_in based on the amplitude controlling signal AM_ctl sent to the controlling input terminal 9a. The memory 4 has written in advance therein data for compensating phase distortion of the power amplifier 12. Thus, phase distortion as well as amplitude distortion can be corrected. That is, the phase compensating data which depends on each input envelope voltage is output by making the data written in the memory 4 correspond to an address which is varied in accordance with the variation of the envelope voltage of the high-frequency signal PA_in and outputting the data. The phase compensating data is converted to analog data by the second D/A converter 6, thereby the analog signal PMa can be obtained. The second low pass filter (LPF2) 8 removes digital noise included in the analog signal PMa and outputs the phase controlling signal PM_ctl. The phase controlling signal PM_ctl is sent to the controlling input terminal 10a of the phase controlling unit 10. The phase controlling unit 10 compensates the phase of the high-frequency signal PA_in whose gain is controlled by the gain controlling unit 9.

On the other hand, along with the digitization, distortion which cannot be compensated undesirably-remains. Such distortion remains in the outputs of the gain controlling unit 9 and the power amplifier 12, respectively. The distortion compensating device according to the present invention is designed so that the respective distortions offset each other so as to consequently remove the distortion which remains in a PA_out being the output of the power amplifier 12.

Generally, it is known that distortion power which is generated by an amplifier depends on terminal impedance of the anterior unit or the posterior unit connected thereto. Accordingly, the value of the matching circuit 11 is set up so that the distortion generated at the gain controlling unit 9 offsets the distortion remaining in the power amplifier 12. That is, the value of the matching circuit 11 is set up so that the phase of the residual distortion included in the output of the matching circuit 11 is rendered opposite to the phase of the residual distortion included in the output of the power amplifier 12. Thus, the residual distortion included in the output of the power amplifier 12 is offset by the residual distortion included in the output of the gain controlling unit 9, thereby the residual distortion can be removed.

Figure 3:
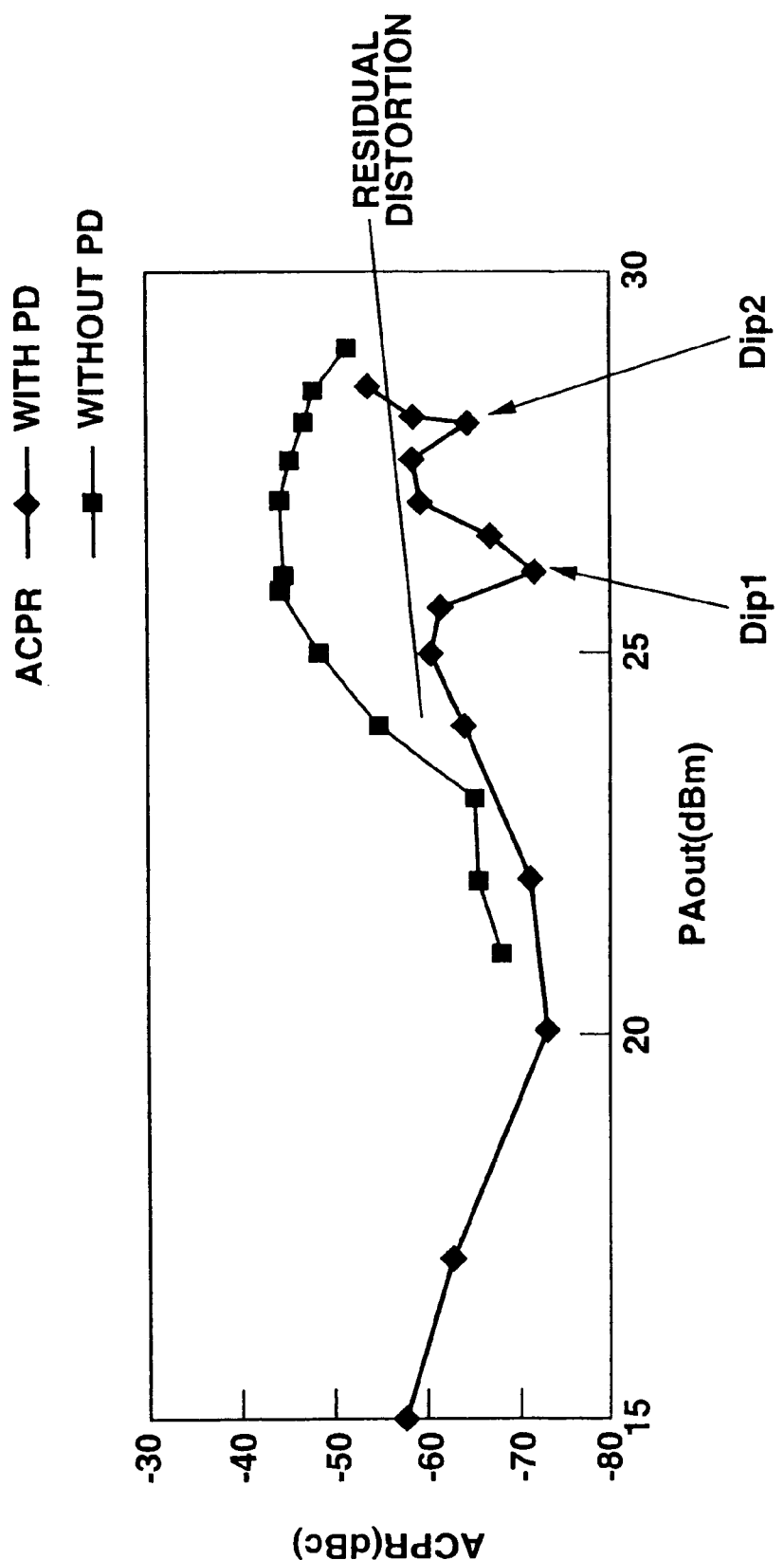
FIG. 3 shows a graphical representation of the distortion result in suppling a modulated digital signal to the power amplifier, in which a case performing the distortion compensation according to the present invention and a case not performing distortion compensation is compared.

FIG. 3 shows a graphical representation of the distortion result of an experiment in suppling a modulated digital signal to the power amplifier 12, in which a case which performs the distortion compensation according to the present invention and a case which does not perform the distortion compensation is compared. As can be seen from the graph, in case the distortion compensation is performed, distortion is suppressed. Even though the distortion remains over a wide range, especially at Dip1 and Dip2 points in the graph, the distortion remaining in the gain controlling unit 9 and that remaining in the power amplifier 12 offset each other, and it can be seen that the distortion is removed by more than 10 dB.

Figure 4:
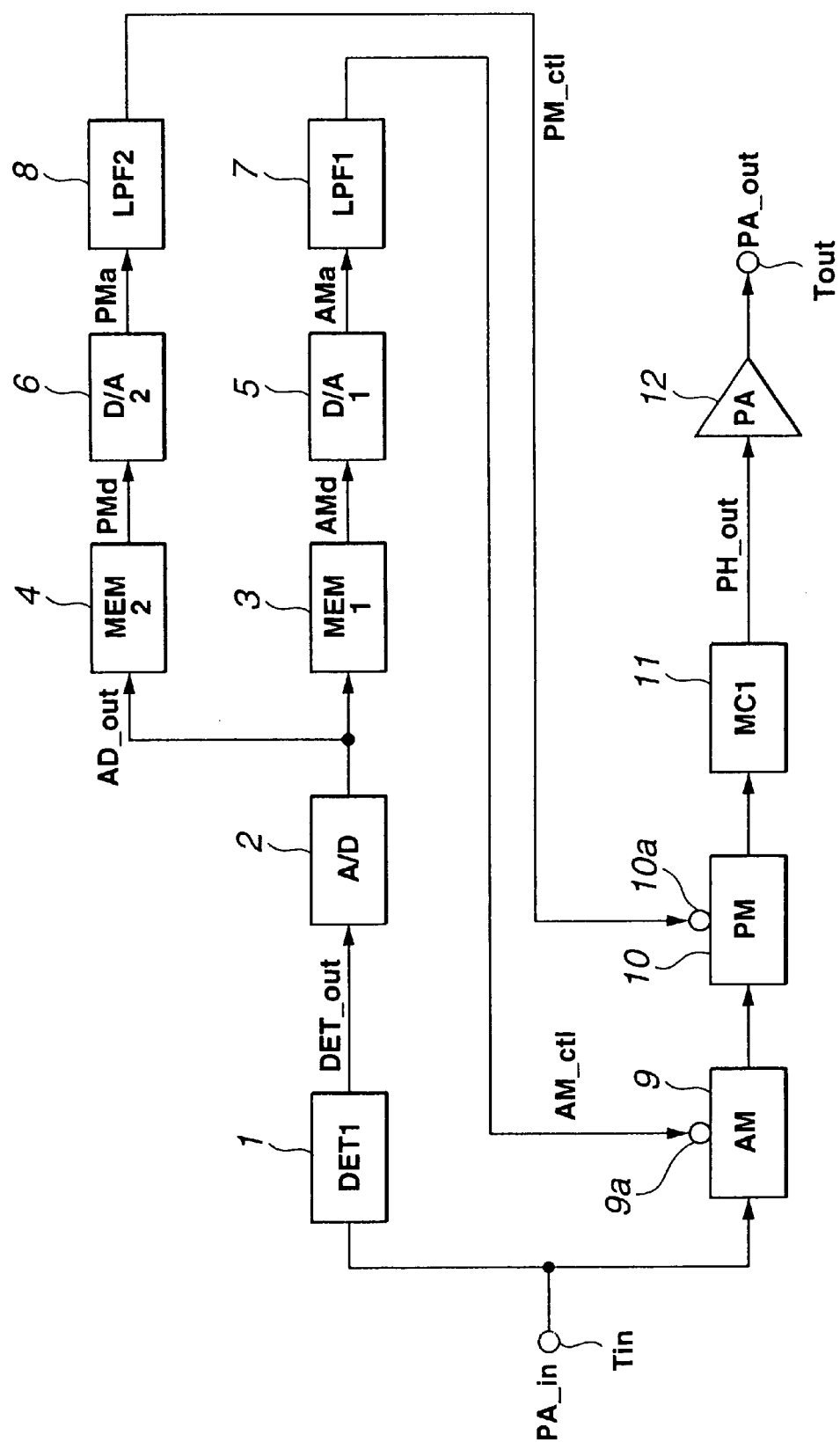
FIG. 4 shows a block diagram of a second embodiment of the applicable distortion compensating device according to the present invention.

FIG. 4 shows a block diagram of a second embodiment of the distortion compensating device according to the present invention. In FIG. 4, the parts or components similar to those of the distortion compensating device shown in FIG. 2 are indicated with the same reference numerals. As shown, in the second embodiment, the matching circuit 11 is connected to the output terminal of the phase controlling unit 10. Since the value of the matching circuit 11 can be recognized by the gain controlling unit 9 via the phase controlling unit 10, it becomes possible to arrange the phase controlling unit 10 in the matching circuit 11. As a result, this configuration is equal to the configuration in which the matching circuit 11 is connected to the output terminal of the gain controlling unit 9, thereby enabling simplification of the matching circuit 11.

According to the present invention, the distortion remaining in a power amplifier can be offset by the distortion generated at a gain controlling unit. So, residual distortion can significantly be removed.

What is claimed is:

1. A distortion compensating device for compensating distortion generated in the device, comprising:

means for detecting an envelope voltage of an input signal supplied to the device;

means for generating an amplitude controlling signal adapted for controlling an amplitude of the input signal in accordance with the envelope voltage detected by the means for detecting an envelope voltage;

means for controlling the amplitude of the input signal based on the amplitude controlling signal generated by the means for generating an amplitude controlling signal, wherein the distortion remaining in an output of the device is compensated based on an output of the means for controlling the amplitude;

matching means for rendering a phase of the distortion included in the output of the means for controlling the amplitude opposite to a phase of the distortion remaining in the output of the device;

means for generating a phase controlling signal adapted for controlling a phase of the input signal in accordance with the envelope voltage detected by the means for detecting; and means for controlling the phase of the input signal based on the phase controlling signal generated by the means for generating the phase controlling signal, wherein the matching means is connected between a posterior portion of the means for controlling the amplitude and an anterior portion of the means for controlling the phase.

2. The distortion compensating device as set forth in claim 1, wherein the phase of distortion included in the output of the matching means is rendered opposite to the phase of the distortion remaining in the output of the device.

3. A distortion compensating device for compensating distortion generated in the device, comprising:

means for detecting an envelope voltage of an input signal supplied to the device;

means for generating an amplitude controlling signal adapted for controlling an amplitude of the input signal in accordance with the envelope voltage detected by the means for detecting an envelope voltage;

means for controlling the amplitude of the input signal based on the amplitude controlling signal generated by the means for generating an amplitude controlling signal, wherein the distortion remaining in an output of the device is compensated based on an output of the means for controlling the amplitude;

matching means for rendering a phase of the distortion included in the output of the means for controlling the amplitude opposite to a phase of the distortion remaining in the output of the device;

means for generating a phase controlling signal adapted for controlling a phase of the input signal in accordance with the envelope voltage detected by the means for detecting;

means for controlling the phase of the input signal based on the phase controlling signal generated by the means for generating the phase controlling signal, wherein the means for generating an amplitude controlling signal comprises means for outputting amplitude correction data in accordance with the envelope voltage; the means for generating a phase controlling signal comprises means for outputting phase correction data in accordance with the envelope voltage; the means for controlling the amplitude controls the amplitude of the input signal in accordance with the amplitude controlling signal generated based on the amplitude correction data output from the means for outputting amplitude correction data, and the means for controlling the phase controls the phase of the input signal in accordance with the phase controlling signal generated based on the phase correction data output from the means for outputting phase correction data; and wherein the matching means is connected between a posterior portion of the amplitude controlling means and an anterior portion of the means for controlling the phase.

4. A method for compensating distortion generated in a device, comprising the steps of:

detecting an envelope voltage of an input signal supplied to the device;

generating an amplitude controlling signal adapted for controlling an amplitude of the input signal in accordance with the envelope voltage detected at the step of detecting an envelope voltage;

controlling the amplitude of the input signal based on the amplitude controlling signal generated at the step of generating an amplitude controlling signal;

generating a phase controlling signal adapted for controlling a phase of the input signal in accordance with the envelope voltage detected at the step of detecting an envelope voltage;

controlling the phase of the input signal based on the phase controlling signal generated at the step of generating a phase controlling signal; and following the step of controlling the amplitude and before the step of controlling the phase, performing a matching operation for rendering a phase of the distortion included in the output following the step of controlling the amplitude opposite to a phase of the distortion in an output of the device.

\* \* \* \* \*